(12) United States Patent
Polet et al.

(10) Patent No.: US 10,001,712 B2
(45) Date of Patent: Jun. 19, 2018

(54) IMMERSION LITHOGRAPHIC APPARATUS AND DEVICE MANUFACTURING METHOD (71) Applicant: ASML Netherlands B.V., Veldhoven (NL)

(72) Inventors: Theodorus Wilhelmus Polet, Geldrop (NL); Johannes Jacobus Matheus Baselmans, Oirschot (NL); Willem Jan Bouman, Moergestel (NL); Han Henricus Aldegonda Lempens, Weert (NL); Theodorus Marinus Modderman, Nuenen (NL); Cornelius Maria Rops, Waalre (NL); Bart Smeets, Bilzen (NL); Koen Steffens, Veldhoven (NL); Ronald Van Der Ham, Maarheeze (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days. days.

(21) Appl. No.: 15/328,376

(22) PCT Filed: Jun. 26, 2015

(86) PCT No.: PCT/EP2015/064500
§ 371 (c)(1),
(2) Date: Jan. 23, 2017

(87) PCT Pub. No.: WO2016/012193
PCT Pub. Date: Jan. 28, 2016

(65) Prior Publication Data
US 2017/0219939 A1    Aug. 3, 2017

(30) Foreign Application Priority Data
Jul. 25, 2014  (EP) .................................... 14178480
Mar. 31, 2015  (EP) .................................... 15161938

(51) Int. Cl.
G03B 27/52  (2006.01)
G03F 7/20  (2006.01)

(52) U.S. Cl.
CPC ...... *G03F 7/70866* (2013.01); *G03F 7/70341* (2013.01)

(58) Field of Classification Search
CPC ............ G03F 7/70525; G03F 7/70775; G03F 7/70341; G03F 7/70958; G03F 7/70883; G03F 9/7046; G03F 9/7049; G03F 9/7092
(Continued)

(56) References Cited

U.S. PATENT DOCUMENTS 6,952,253 B2  10/2005  Lof et al.
7,561,250 B2  7/2009  Liebregts et al.
(Continued)

FOREIGN PATENT DOCUMENTS

CN  101329517  12/2008
EP  1 420 298  5/2004
(Continued)

OTHER PUBLICATIONS

International Search Report and Written Opinion dated Oct. 9, 2015 in corresponding International Patent Application No. PCT/EP2015/064500.
(Continued)

*Primary Examiner* — Peter B Kim
(74) *Attorney, Agent, or Firm* — Pillsbury Winthrop Shaw Pittman LLP (57) ABSTRACT

An immersion lithographic apparatus includes a projection system. The projection system is configured to project a patterned radiation beam through an immersion liquid onto a target portion of a substrate. An external surface of the projection system includes a first surface. The first surface
(Continued)

has a non-planar shape. An element is attached to the first surface and positioned so that at least a portion of the element contacts the immersion liquid in use. The element includes a closed loop of continuously integral material in a preformed state and conforms to the non-planar shape of the first surface.

20 Claims, 8 Drawing Sheets

(58) Field of Classification Search
USPC .......................................................... 355/30
See application file for complete search history.

(56) References Cited

U.S. PATENT DOCUMENTS

| | | | |
|---|---|---|---|
| 8,462,314 | B2 | 6/2013 | Beckers et al. |
| 8,889,042 | B2 | 11/2014 | Dziomkina |
| 8,928,857 | B2 | 1/2015 | Thomas et al. |
| 9,176,371 | B2 | 11/2015 | Bruijstens et al. |
| 9,182,678 | B2 | 11/2015 | Van De Kerkhof et al. |
| 2004/0207824 | A1 | 10/2004 | Lof et al. |
| 2007/0146663 | A1 | 6/2007 | Nagasaka |
| 2008/0316441 | A1 | 12/2008 | Liebregts et al. |
| 2009/0135385 | A1 | 5/2009 | Gellrich et al. |
| 2009/0206304 | A1 | 8/2009 | Dziomkina |
| 2010/0045949 | A1 | 2/2010 | Nakano et al. |
| 2010/0066987 | A1 | 3/2010 | Bruijstens et al. |
| 2010/0271606 | A1 | 10/2010 | Sanderse et al. |
| 2010/0296067 | A1 | 11/2010 | Thomas et al. |
| 2012/0177881 | A1 | 7/2012 | Lee et al. |
| 2012/0274912 | A1 | 11/2012 | Van De Kerkhof et al. |
| 2013/0038849 | A1 | 2/2013 | Weippert |

FOREIGN PATENT DOCUMENTS

| | | |
|---|---|---|
| JP | 2009-004777 | 1/2009 |
| JP | 2009-164573 | 7/2009 |
| JP | 2009-194385 | 8/2009 |
| JP | 2010-258446 | 11/2010 |
| JP | 2012-142625 | 7/2012 |
| WO | 2007/144125 | 12/2007 |
| WO | 2013/087300 | 6/2013 |

OTHER PUBLICATIONS

Chinese Office Action dated Sep. 29, 2017 in corresponding Chinese Patent Application No. 201580039206.8.
Japanese Office Action dated Mar. 13, 2018 in corresponding Japanese Patent Application No. 2017-524096.

IMMERSION LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2015/064500, which was filed on Jun. 26, 2015, which claims the benefit of priority of European patent application no. 14178480.1, which was filed on Jul. 25, 2014, and European patent application no. 15161938.4, which was filed on Mar. 31, 2015, and which are incorporated herein in their entirety by reference.

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In an immersion lithographic apparatus, immersion fluid is handled by a fluid handling system or apparatus. In an embodiment the fluid handling system or apparatus may supply immersion fluid and therefore comprise or consist of a fluid supply system or apparatus. In an embodiment the fluid handling system or apparatus may at least partly confine immersion fluid. In an embodiment the fluid handling system or apparatus may provide a barrier to immersion fluid and thereby comprise or consist of a barrier member, such as a fluid confinement structure. In an embodiment the fluid handling system or apparatus may create or use a flow of gas, for example to help in controlling the flow and/or the position of the immersion fluid. The flow of gas may form a seal to confine the immersion fluid so the fluid handling system or apparatus may be referred to as a seal member; such a seal member may be a fluid confinement structure. In an embodiment, immersion liquid is used as the immersion fluid. In that case the fluid handling system or apparatus may be a liquid handling system or apparatus. In the following description, reference to a feature defined with respect to fluid may be understood to include a feature defined with respect to liquid.

In some immersion lithographic apparatus, there is a gap between the liquid confinement structure and the final element of the projection system (sometimes referred to as the WELLE lens). A free meniscus of the immersion liquid may be located in the gap. Typically, gas flows through the apparatus for thermal conditioning. Some of the gas stream may flow into the gap, over the liquid confinement structure. The gas stream may disadvantageously cause the immersion liquid to evaporate, thereby applying a thermal load on the liquid confinement structure and the projection system. The thermal load may cause thermal (e.g., cold) spots on the projection system. Depending on the location of the meniscus, the thermal spots may cause optical aberrations and/or may contribute to overlay/focus irregularity. In addition, some of the immersion liquid may escape from the liquid confinement structure by passing through the gap.

During exposure, the substrate table is moved relative to the liquid confinement structure (and the projection system). The movement may cause the immersion liquid within the liquid confinement structure to move up the gap, e.g., in the direction of travel of the substrate. When the substrate is moved through a scanning or stepping motion, the direction of movement of the substrate changes. Because the immersion liquid in the gap moves with the movement of the substrate, the movement causes the level of the immersion liquid in the gap to change. The movement of the immersion liquid may be referred to as sloshing. If the movement is sufficiently large, the pressure on the immersion liquid may be sufficient to cause the liquid to overflow onto the top surface of the liquid confinement structure. When the pressure decreases, liquid flows back into the gap, possibly taking with it unwanted contaminating particles present on the surface of the liquid confinement structure. Liquid may also be left on the top surface of the liquid confinement structure, and on a surface of the projection system. The remaining liquid may subsequently evaporate into the surrounding gas and thus apply a thermal load to the respective surfaces.

A material that is liquidphobic with respect to the immersion liquid may be provided on an external surface of the projection system in the region of the gap. During sloshing, the liquidphobic material can help prevent the immersion liquid from moving too far upwards or outwards along the gap. The liquidphobic material may reduce the amount of liquid that is left behind on the projection system when the liquid level recedes. The liquidphobic material may shape the meniscus so as to reduce heat transfer from the projection system. The liquidphobic material may be applied as a coating or as a sticker.

It is an object of the invention to provide apparatus and methods for providing a material on an external surface of the projection system in an effective manner.

SUMMARY

According to an aspect, there is provided an immersion lithographic apparatus, comprising: a projection system configured to project a patterned radiation beam through an immersion liquid onto a target portion of a substrate, an external surface of the projection system comprising a first surface having a non-planar shape; and an element attached to the first surface and positioned so that at least a portion of the element contacts the immersion liquid in use, wherein: the element comprises a closed loop of continuously integral material in a preformed state and conforming to the non-planar shape of the first surface.

According to an aspect, there is provided a device manufacturing method, comprising: using a projection system to project a patterned radiation beam through an immersion liquid onto a target portion of a substrate, wherein: an external surface of the projection system comprises a first surface having a non-planar shape; and an element is attached to the first surface, the element being positioned so that at least a portion of the element contacts the immersion liquid in use, wherein: the element comprises a closed loop of continuously integral material in a preformed state and conforming to the non-planar shape of the first surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
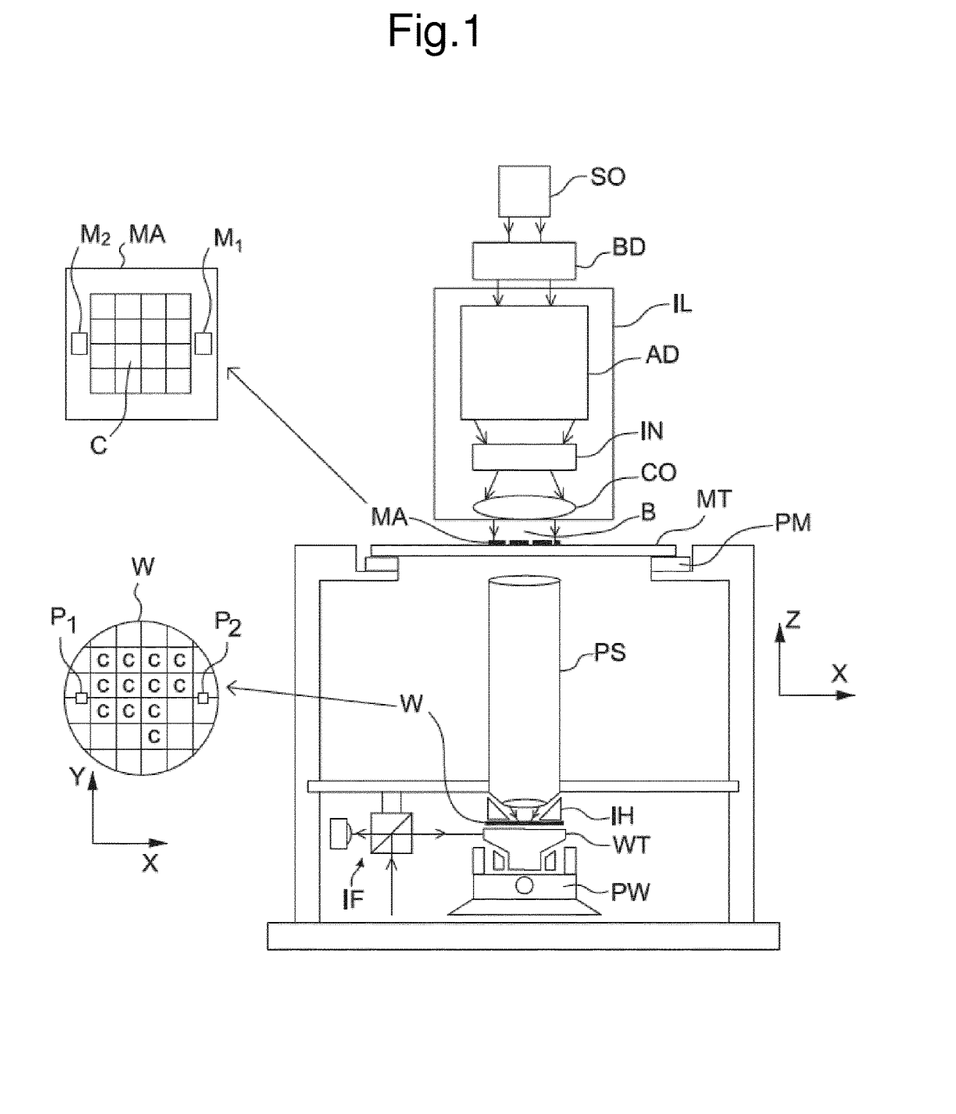
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure (e.g. a mask table) MT constructed to support a patterning device (e.g. a mask) MA and connected to a first positioning device PM configured to accurately position the patterning device MA in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate W in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device MA (e.g., mask), which is held on the support structure MT (e.g., mask table), and is patterned by the patterning device MA. Having traversed the mask, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask with respect to the path of the radiation beam B, e.g. after mechanical retrieval from a mask library, or during a scan. In general, movement of the mask table may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table may be connected to a short-stroke actuator only, or may be fixed. Mask and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask, the mask alignment marks may be located between the dies.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

Figure 2:
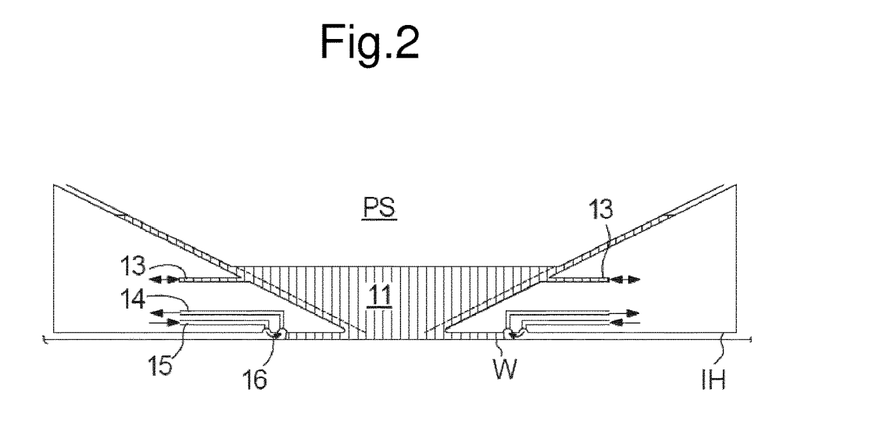
FIG. 2 depicts a liquid supply system for use in a lithographic apparatus.

An arrangement which has been proposed is to provide the liquid supply system with a liquid confinement structure which extends along at least a part of a boundary of the space between the final element of the projection system and the substrate, substrate table or both. Such an arrangement is illustrated in FIG. 2. The arrangement illustrated in FIG. 2 and described below may be applied to the lithographic apparatus described above and illustrated in FIG. 1.

FIG. 2 schematically depicts a localized liquid supply system or fluid handling system with a liquid confinement structure IH, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) In an embodiment, a seal is formed between the liquid confinement structure IH and the surface of the substrate W and which may be a contactless seal such as a gas seal 16 (such a system with a gas seal is disclosed in European patent application publication no. EP-A-1,420,298) or a liquid seal.

The liquid confinement structure IH at least partly contains liquid in the space 11 between the final element of the projection system PS and the substrate W. The space 11 is at least partly formed by the liquid confinement structure IH positioned below and surrounding the final element of the projection system PS. Liquid is brought into the space 11 below the projection system PS and within the liquid confinement structure IH by opening 13. The liquid may be removed by opening 13. Whether liquid is brought into the space 11 or removed from the space 11 by the opening 13 may depend on the direction of movement of the substrate W and substrate table WT.

The liquid may be contained in the space 11 by the gas seal 16 which, during use, is formed between the bottom of the liquid confinement structure IH and the surface of the substrate W. The gas in the gas seal 16 is provided under pressure via gas inlet 15 to the gap between the liquid confinement structure IH and substrate W. The gas is extracted via a channel associated with outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure IH and the substrate W contains the liquid in the space 11. Such a system is disclosed in United States patent application publication no. US 2004-0207824, which is hereby incorporated by reference in its entirety. In an embodiment, the liquid confinement structure IH does not have a gas seal.

In a localized area liquid supply system, the substrate W is moved under the projection system PS and the liquid supply system. When, for example, an edge of the substrate W is to be imaged or when a sensor on the substrate table (or on a measurement table) is to be imaged or the substrate table WT is to be moved such that a dummy substrate or so-called closing plate can be positioned under the liquid supply system to enable, for example, substrate swap to take place, an edge of the substrate W (or other object) will pass under the space 11. Liquid may leak into the gap between the substrate W and substrate table WT. This liquid may be forced in under hydrostatic or hydrodynamic pressure or the force of a gas knife or other gas flow creating device.

Figure 3:
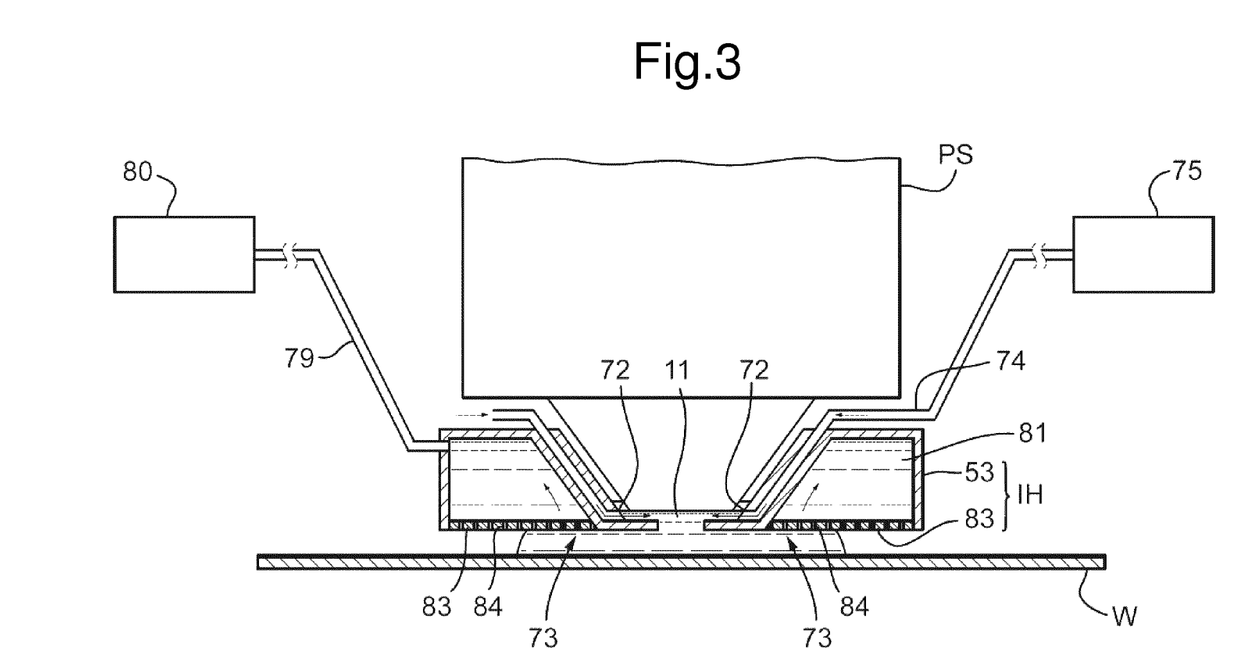
FIG. 3 is a side cross sectional view that depicts a further liquid supply system according to an embodiment.

FIG. 3 is a side cross sectional view that depicts a further liquid supply system or fluid handling system according to an embodiment. The arrangement illustrated in FIG. 3 and described below may be applied to the lithographic apparatus described above and illustrated in FIG. 1. The liquid supply system is provided with a liquid confinement structure IH, which extends along at least a part of a boundary of the space between the final element of the projection system PS and the substrate table WT or substrate W. (Please note that reference in the following text to surface of the substrate W also refers in addition or in the alternative to a surface of the substrate table WT, unless expressly stated otherwise.)

The liquid confinement structure IH at least partly contains liquid in the space 11 between the final element of the projection system PS and the substrate W. The space 11 is at least partly formed by the liquid confinement structure IH positioned below and surrounding the final element of the projection system PS. In an embodiment, the liquid confinement structure IH comprises a main body member 53 and a porous member 83. The porous member 83 is plate shaped and has a plurality of holes (i.e., openings or pores). In an embodiment, the porous member 83 is a mesh plate wherein numerous small holes 84 are formed in a mesh. Such a system is disclosed in United States patent application publication no. US 2010/0045949 A1, which is hereby incorporated by reference in its entirety.

The main body member 53 comprises supply ports 72, which are capable of supplying the liquid to the space 11, and a recovery port 73, which is capable of recovering the liquid from the space 11. The supply ports 72 are connected to a liquid supply apparatus 75 via passageways 74. The liquid supply apparatus 75 is capable of supplying the liquid to the supply ports 72. The liquid that is fed from the liquid supply apparatus 75 is supplied to each of the supply ports 72 through the corresponding passageway 74. The supply ports 72 are disposed in the vicinity of the optical path at prescribed positions of the main body member 53 that face the optical path. The recovery port 73 is capable of recovering the liquid from the space 11. The recovery port 73 is connected to a liquid recovery apparatus 80 via a passageway 79. The liquid recovery apparatus 80 comprises a vacuum system and is capable of recovering the liquid by suctioning it via the recovery port 73. The liquid recovery apparatus 80 recovers the liquid LQ recovered via the recovery port 73 through the passageway 79. The porous member 83 is disposed in the recovery port 73.

In an embodiment, to form the space 11 with the liquid between the projection system PS and the liquid confinement structure IH on one side and the substrate W on the other side, liquid is supplied from the supply ports 72 to the space 11 and the pressure in a recovery chamber 81 in the liquid confinement structure IH is adjusted to a negative pressure so as to recover the liquid via the holes 84 (i.e., the recovery port 73) of the porous member 83. Performing the liquid supply operation using the supply ports 72 and the liquid recovery operation using the porous member 83 forms the space 11 with the liquid between the projection system PS and the liquid confinement structure IH on one side and the substrate W on the other side.

Figure 14:
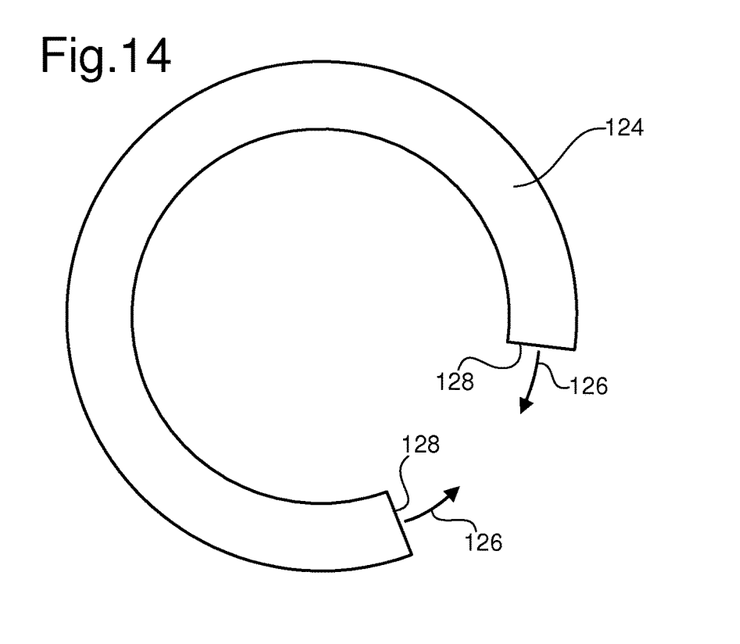
FIG. 14 is a top view of a prior art sticker.
Figure 15:
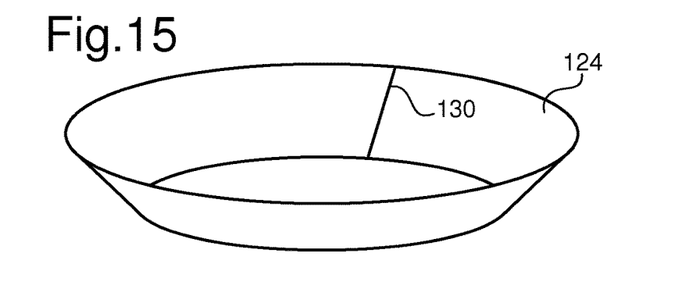
FIG. 15 is a perspective view of a prior art sticker formed into a three-dimensional shape.

As mentioned in the introductory part of the description, it is known to apply a liquidphobic material to the projection system PS which contacts the immersion liquid in use. An example is disclosed in FIG. 8 of US 2012274912 A1. Coatings have a limited life and will need to be reapplied after a period of time. Reapplying the liquidphobic material as a coating typically requires specialist equipment and can therefore be inconvenient for a user of the lithographic apparatus. Applying the coating may be time consuming, meaning that significant downtime is required to reapply the coating. Reapplying the liquidphobic material as a sticker may be more convenient. Less or no specialist equipment may be needed. However, applying the sticker can still require significant downtime. The durability of stickers can be limited and unpredictable. Liquid can penetrate gradually into the region underneath the sticker at edges of the sticker that are exposed to the liquid or at interfaces between different stickers (where a plurality of stickers are used) that are exposed to the liquid. This liquid penetration undermines the integrity of the stickers by disrupting the adhesion of the stickers to the projection system. A plurality of stickers may be used where a complex non-planar (three-dimensional) surface needs to be covered by the stickers. It is conventional to provide the stickers initially in flat form. The stickers may then be curved and/or joined together in order to form the required non-planar shape. Certain non-planar shapes can be covered with a single sticker. For certain types of non-planar shapes that form a continuous loop around an axis, the sticker may not itself be able to form a continuous loop while still conforming with the surface. An example of such a surface is a frusto-conical surface. In such a case, the sticker needs to be provided in a broken loop, with the broken ends of the loop being separated from each other when the sticker is in its initially flat state. An example of such a sticker 124 is shown schematically in FIG. 14. The broken ends 128 of the sticker loop are brought together (arrows 126) so as to abut against each other when the sticker 124 is bent into the non-planar shape and adhered to the surface. FIG. 15 is a schematic depiction of the sticker 124 of FIG. 14 after it has been bent into the non-planar shape. The line of abutment 130 between the two broken ends 128 of the sticker 124 constitutes an interface which can be vulnerable to penetration by the liquid. Penetration by the liquid can disrupt adhesion of the sticker 124 to the projection system PS and reduce the lifetime of the sticker 124.

Embodiments of a lithographic apparatus which at least partially address the above problems will now be described. In these embodiments the lithographic apparatus may be configured as described above with reference to FIG. 1. The lithographic apparatus comprises a fluid confinement structure. The fluid confinement structure may form part of a fluid supply system or a liquid supply system as described above and illustrated in FIG. 2 or FIG. 3.

Figure 4:
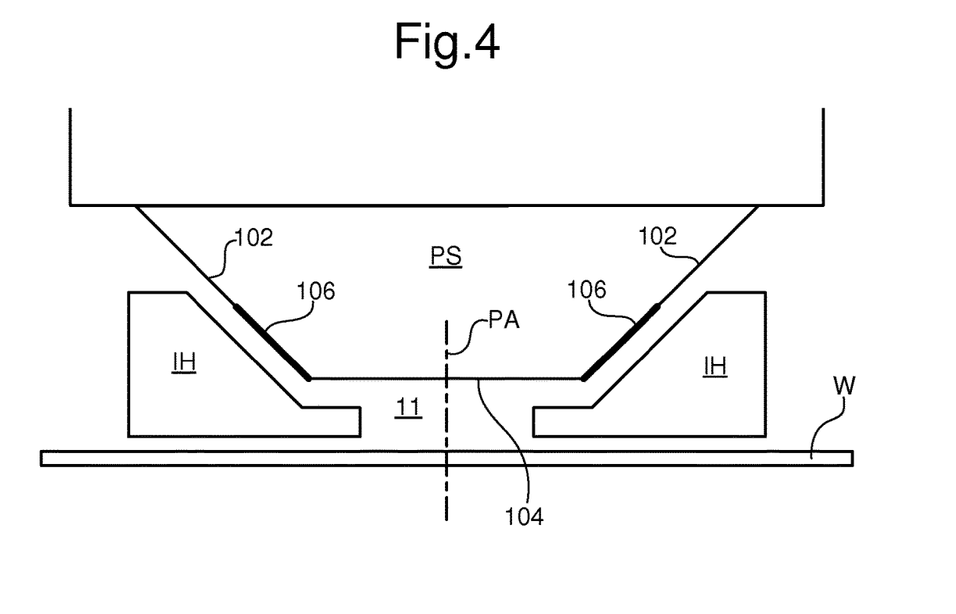
FIG. 4 depicts a lithographic apparatus having an element adhered to a first surface of a projection system.

FIG. 4 depicts a lithographic apparatus according to an embodiment. The lithographic apparatus comprises a projection system PS. The projection system PS is configured to project a patterned radiation beam B through an immersion liquid onto a target portion C of a substrate W. A liquid confinement structure IH is provided that surrounds and at least in part defines a space 11 for confining the immersion liquid. The immersion liquid is confined between an external surface of the projection system PS and the substrate W. The external surface of the projection system PS comprises a first surface 102. In an embodiment, the first surface 102 is radially outside of an exit surface 104 with respect to a projection axis PA of the projection system PS. The exit surface 104 is a surface through which the patterned radiation beam B exits the projection system PS along the projection axis PA. In an embodiment, the first surface 102 surrounds the projection axis PA (i.e. forms a closed loop around the projection axis PA).

The first surface 102 has a non-planar (three-dimensional) shape. In an embodiment, the non-planar shape is such that the non-planar shape cannot be formed by bending of a notional element that is: 1) initially planar and formed in a closed loop; and 2) not allowed to undergo extension over the whole thickness of the notional element in any direction that is perpendicular to the thickness of the notional element in any region of the notional element, or to undergo compression over the whole thickness of the notional element in any direction that is perpendicular to the thickness of the notional element in any region of the notional element, during the bending. A sheet of paper with a hole cut into it (e.g. an annular piece of paper) is an example of an element that can satisfy the requirements (1) and (2) above. It will be appreciated that it is not possible to bend an annular piece of paper into a frusto-conical form for example without tearing the paper.

In an embodiment the notional element is also constrained to maintain zero Gaussian curvature at all points in the element during the bending. Gaussian curvature is a well known concept in differential geometry. The Gaussian curvature of a point on a surface is a product of the principle curvatures of the point. An element that has zero Gaussian curvature at all points is an element that cannot be curved along two different axes at any point. One of the principle curvatures is therefore always zero. Paper is a well known example of an element that is constrained to maintain zero Gaussian curvature at all points in the element during bending.

In the embodiment shown in FIG. 4, the first surface 102 has a frusto-conical form and is inclined at about 45° relative to the projection axis PA. A frusto-cone is an example of a shape that cannot be formed by bending of a notional element that is 1) initially planar and formed in a closed loop; and 2) not allowed to undergo extension over the whole thickness of the notional element in any direction that is perpendicular to the thickness of the notional element in any region of the notional element, or to undergo compression over the whole thickness of the notional element in any direction that is perpendicular to the thickness of the notional element in any region of the notional element, during the bending. In other embodiments the first surface 102 may take other shapes, for example frusto-conical shapes inclined at other angles or shapes that comprise a portion of a frusto-cone together with one or more other shapes.

Figure 5:
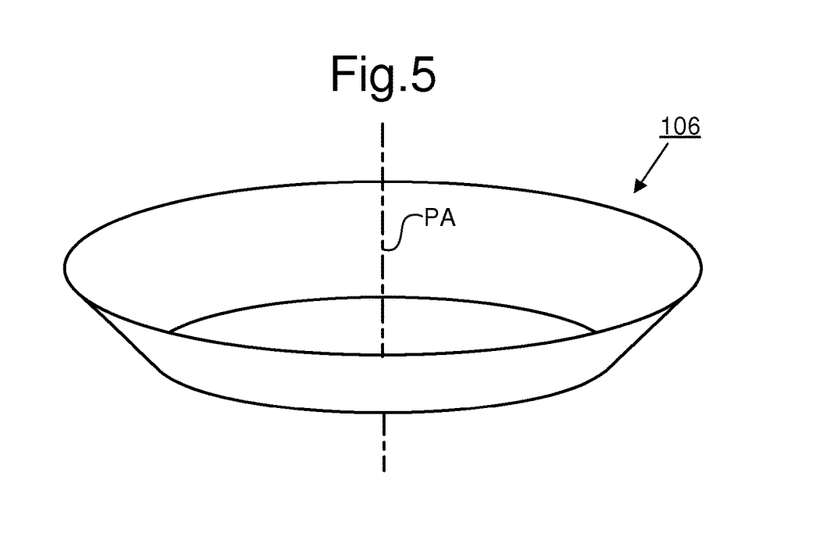
FIG. 5 is a schematic perspective view of the element of FIG. 4.
Figure 6:
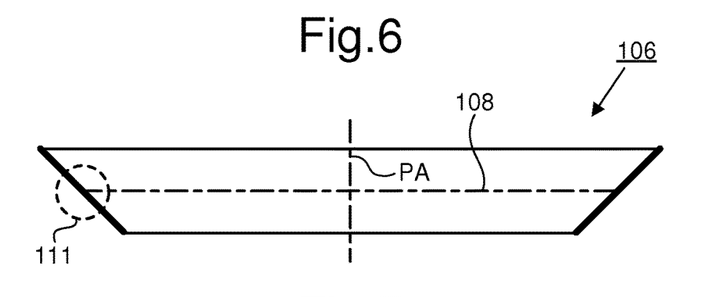
FIG. 6 is a schematic side sectional view of the element of FIG. 5.
Figure 7:
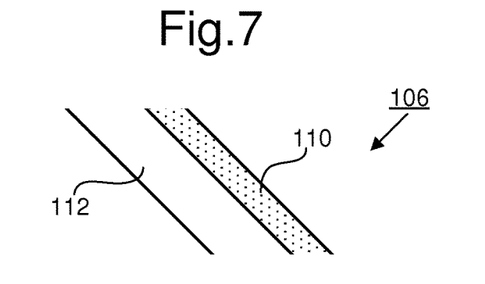
FIG. 7 is a schematic side sectional view of a portion of the element of FIG. 6.

In an embodiment, the lithographic apparatus further comprises an element 106 attached to the first surface 102. The element 106 is positioned so that at least a portion of the element 106 contacts the immersion liquid in use (e.g. while the projection system PS is projecting a patterned radiation beam B onto the substrate W and/or the substrate W is being moved relative to the projection system PS). The contacting may be continuous or intermittent. The element 106 of FIG. 4 is depicted in further detail in FIGS. 5-7, detached from the rest of the lithographic apparatus.

Figure 8:
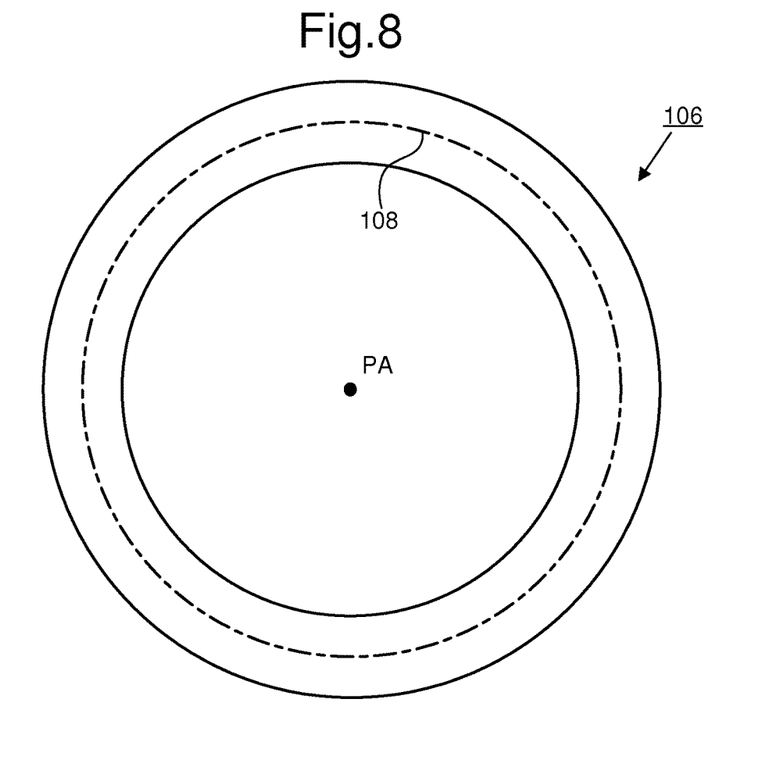
FIG. 8 is a schematic top view of the element of FIGS. 5-7.
Figure 9:
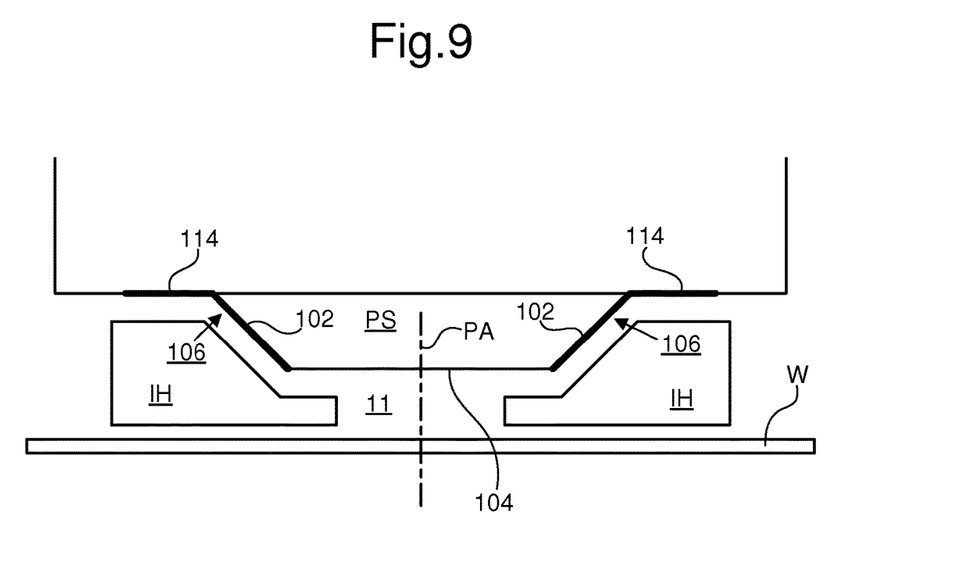
FIG. 9 depicts a lithographic apparatus having an element adhered to a first and a second surface of a projection system.
Figure 10:
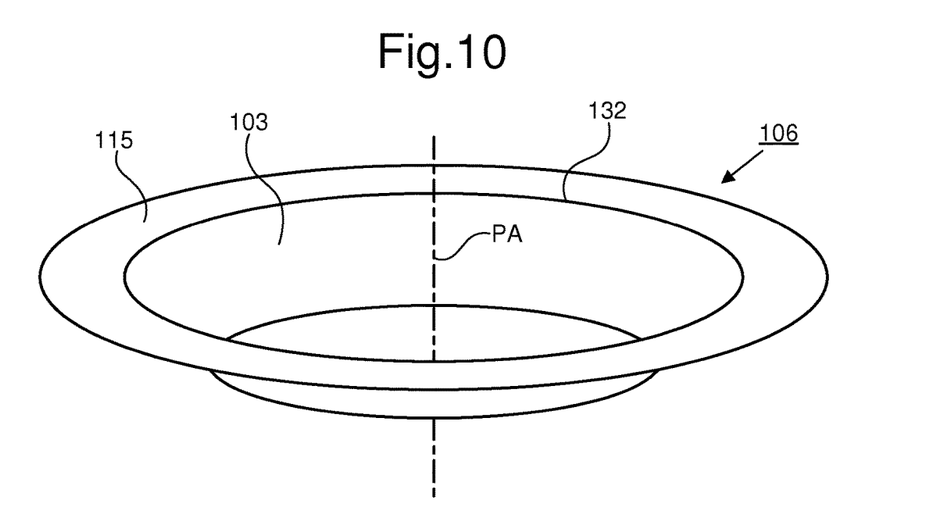
FIG. 10 is a schematic perspective view of the element of FIG. 9.
Figure 11:
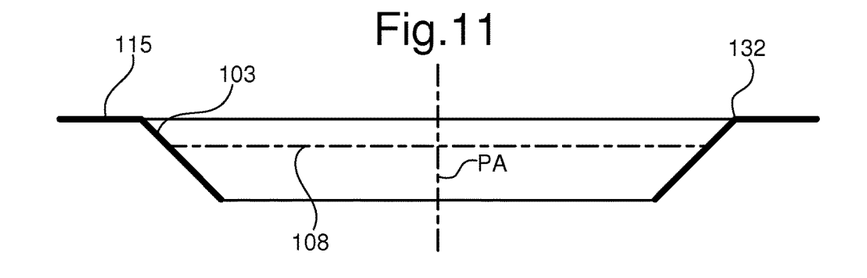
FIG. 11 is a schematic side sectional view of the element of FIG. 10.
Figure 12:
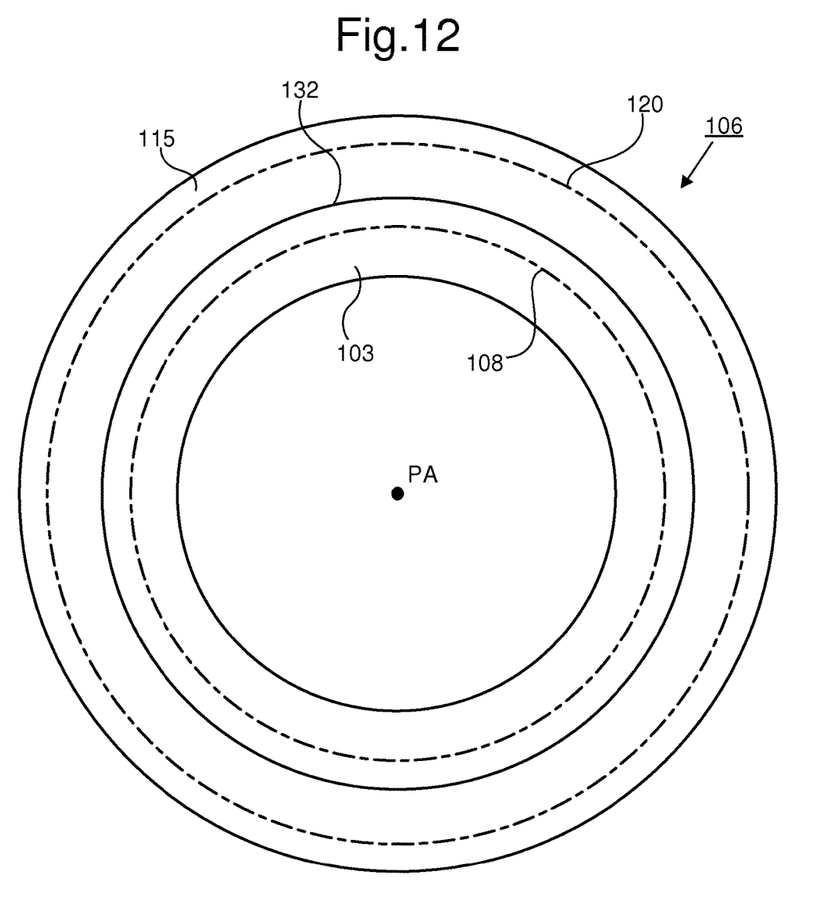
FIG. 12 is a schematic top view of the element of FIGS. 10 and 11.

In an embodiment, the element 106 comprises a closed loop 108 of continuously integral material. The element 106 is provided in a preformed state (e.g. not as a coating). The element 106 is further provided in a state which conforms to (e.g. has the same shape as) the non-planar shape of the first surface 102. In an embodiment the element 106 is configured such that the element 106 would retain the non-planar shape of the first surface 102 even if unattached to the first surface 102. In an embodiment, the closed loop 108 surrounds the projection axis PA. The projection axis PA therefore passes through the closed loop 108 in such an embodiment. An example path for the closed loop 108 is depicted by the dot-chain line labeled 108 in FIGS. 6 and 8. In an embodiment, the continuously integral material comprises a liquidphobic material 112. The liquidphobic material 112 is liquidphobic with respect to the immersion liquid (i.e. provides a surface that tends to repel the immersion liquid). Thus, in the case where the immersion liquid is water, the liquidphobic material 112 will be hydrophobic (or at least have a hydrophobic surface). In an embodiment, the liquidphobic material 112 is such that the immersion liquid will make a contact angle with the liquidphobic material 112 that is greater than 90° but less than 180°, e.g. 100°, 110°, 120°, etc., up to 180°.

In an embodiment, the element 106 is adhered to the first surface 102 by means of an adhesive 110. The adhesive 110 may or may not be considered as part of the element 106. The adhesive 110 has a different composition from that of the continuously integral (e.g. liquidphobic) material 112. The adhesive 110 may be provided on the element 106 prior to connection of the element 106 to the projection system PS. This is the case for example in the arrangement of FIG. 7. Alternatively or additionally, the adhesive 110 may be applied to the projection system PS before connection of the element 106 to the projection element PS.

In an embodiment, the element 106 is provided in a non-planar shape corresponding to the non-planar shape of the first surface 102, prior to connection to the first surface 102. In an embodiment, the element 106 is configured such that connection of the element 106 to the first surface 102 can be carried out with little or no deformation of the element 106 (e.g. extension or compression in directions perpendicular to the thickness of the element 106) during the connection process.

The element 106 may be referred to as a sticker. Stickers are normally provided in flat form. Stickers that are provided in flat form may be shaped so as to cover non-planar surfaces (i.e. surfaces that are not flat). However, not all non-planar surfaces can be covered optimally with a sticker that is initially flat. As described above with reference to FIGS. 14 and 15, for example, using a flat sticker to cover certain types of non-planar surfaces would result in the creation of interfaces along one or more lines of abutment between different parts of the sticker. For the example of a first surface 102 having a frusto-conical shape, see line of abutment 130 in FIG. 15 between broken ends 128 of the sticker 124 in FIG. 14. Penetration by immersion liquid into the interface(s) can disrupt adhesion and undermine the integrity of the sticker 124. Providing a preformed element 106 in a non-planar and closed loop form that conforms to the first surface 102 can reduce the number of interfaces that exist with edges of the element 106. For example, the interface corresponding to the line of abutment 130 in FIG. 15 no longer needs to exist. The extent to which immersion liquid can enter into the region beneath the element 106 after it has been adhered to the first surface 102 may thereby be reduced. The speed with which the adhesion of the element 106 to the first surface 102 is degraded may be reduced. The longevity and reliability of the element 106 may be increased. Downtime associated with replacing the element 106 may be reduced. Reliability of the lithographic apparatus may be increased.

In an embodiment, the continuously integral material of the element 106 comprises liquidphobic material 112 that is in direct contact with the adhesive 110. The embodiment of FIGS. 5 to 8 is an example of this type. Embodiments of this type can be particularly simple in construction, and may use space efficiently (e.g. be relatively thin).

In an embodiment the element 106 is disconnectable from the first surface 102 in a single piece. The disconnection can be achieved in such a way that the closed loop 108 remains closed. The liquidphobic element 106 can therefore be detached easily and conveniently from the first surface 102. Optionally the liquidphobic element 106 is configured so that no residue (e.g. left-over adhesive 110) is left on the first surface 102 after detachment. Replacement of the liquidphobic element 106 is thereby facilitated. In an embodiment, the element 106 is disconnectable from the first surface 102 by manually peeling the element 106 away from the first surface 102. This arrangement may be particularly convenient for a user. No special equipment may be required for disconnecting the element 106.

In an embodiment, the continuously integral material comprises PTFE, which is hydrophobic, or a hydrophobic polyimide film such as Kapton™. The chemical name for Kapton™ is poly (4,4'-oxydiphenylene-pyromellitimide).

Figure 13:
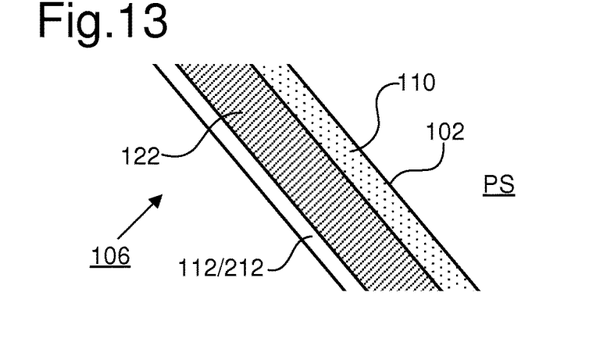
FIG. 13 is a schematic side sectional view of a portion of an element that comprises a liquidphobic material layer and a support layer.

In an embodiment, the element 106 comprises a layer of liquidphobic material (which may be referred to as a liquidphobic material layer 212) supported by a support layer 122, for example in a layered structure. An example of such a structure is illustrated schematically in FIG. 13. FIG. 13 is a schematic side section view of a portion of the element 106 connected to the first surface 102 of the projection system PS. The support layer 122 may have a higher rigidity than the liquidphobic material layer 212. In an embodiment the support layer 122 may be in direct contact with the adhesive 110 (in addition to or instead of the liquidphobic material of the liquidphobic material layer 212 being in direct contact with the adhesive 110). The provision of a support layer 122 in addition to the liquidphobic material layer 212 increases the range of materials that can be used for the liquidphobic material layer 212. For example, layers that do not have sufficient structural integrity or rigidity to be used on their own in combination with an adhesive 110 can nevertheless be used as liquidphobic material layers in embodiments that include the support layer 122.

In an embodiment having the liquidphobic material layer 212 in combination with the support layer 122, the liquidphobic material layer 212 may comprise a liquidphobic coating formed on the support layer 122. In an embodiment the liquidphobic coating has a thickness that is substantially less than the thickness of the support layer 122. A wide range of materials can be applied using coating methods. The materials can be used in lower quantities than layers formed using other techniques, particularly where the layers do not have to provide any rigidity themselves (because they are supported by the support layer 122).

In a further embodiment, as depicted in FIGS. 9-12, the external surface of the projection system PS further comprises a second surface 114. The second surface 114 is radially outside of the first surface 102 (relative to the projection axis PA). The second surface 114 is inclined relative to the first surface 102. The element 106 in this embodiment comprises a first integrally formed portion 103 that forms a closed loop 108 (as shown for example in FIGS. 11 and 12) of continuously integral material. In an embodiment, the closed loop 108 surrounds the projection axis PA. In an embodiment, the first integrally formed portion 103 is attached (e.g. adhered) to the first surface 102.

In this embodiment, the element 106 comprises a second integrally formed portion 115. The second integrally formed portion 115 forms a closed loop 120 (see dot-chain line 120) of continuously integral material. In an embodiment, the closed loop 120 surrounds the projection axis PA. The second integrally formed portion 115 is attached (e.g. adhered) to the second surface 114.

In an embodiment, the first integrally formed portion 103 is joined integrally to the second integrally formed portion 115 along a continuous line 132. In an embodiment, the continuous line 132 surrounds the projection axis PA. In an embodiment the second surface 114 is inclined relative to the first surface 102 at all points along the continuous line 132.

The combination of the first integrally formed portion 103 and the second integrally formed portion 115 provides continuous coverage of the first surface 102 and the second surface 114. The continuous coverage minimizes interfaces. The possibility of penetration of liquid is therefore reduced. The reliability and longevity of the adherence of the element 106 is therefore increased.

In an embodiment, the second surface 114 is perpendicular to the projection axis PA. In an embodiment the second surface 114 is planar. In an embodiment, the element 106 comprises a single, integral piece of liquidphobic material that is in direct contact with the adhesive 110.

In an embodiment, the element 106 is disconnectable from the first surface 102 and the second surface 114 in a single piece and in such a way that the closed loop 108 of the first integrally formed portion 103 and the closed loop 120 of the second integrally formed position 115 remain closed. The element 106 can therefore be detached easily and conveniently from the first surface 102 and the second surface 114. Optionally the element 106 is configured so that no residue (e.g. left-over adhesive 110) is left on the first surface 102 or the second surface 114 after detachment. Replacement of the element 106 is thereby facilitated.

In an embodiment, the element 106 is disconnectable from the first surface 102 and the second surface 114 by manually peeling the element 106 away from the first surface 102 and the second surface 114. This arrangement may be particularly convenient for a user. No special equipment may be required for disconnecting the element 106.

In the embodiment shown of FIGS. 9-12, the first surface 102 is frusto-conical and the second surface 114 is a flat annular ring. In other embodiments either or both of the first surface 102 and the second surface 114 may take different forms.

A device manufacturing method using any of the embodiments discussed above, or other embodiments, may be provided. The device manufacturing method may comprise using a liquid confinement structure IH to confine immersion liquid between an external surface of a projection system PS and a substrate W. The method may further comprise using the projection system PS to project a patterned radiation beam B onto a target portion C of the substrate W through the immersion liquid. In an embodiment the external surface of the projection system PS comprises a first surface 102. In embodiment, the first surface 102 is radially outside of an exit surface 104. The exit surface 104 is a surface through which the patterned radiation beam B exits the projection system PS along a projection axis PA of the projection system PS. In an embodiment, the first surface 102 surrounds the projection axis PA. The first surface 102 has a non-planar shape. An element 106 is provided. The element 106 forms a closed loop 108 of continuously integral material. The element 106 is provided in a preformed state (e.g. not as a coating). The element 106 is further provided in a state which conforms to (e.g. has the same shape as) the non-planar shape of the first surface 102. In an embodiment the element 106 is configured such that the element 106 would retain the non-planar shape of the first surface 102 even if unattached to the first surface 102. In an embodiment, the closed loop 108 surrounds the projection axis PA. In an embodiment the continuously integral material comprises a liquidphobic material 112. The liquidphobic material 112 is liquidphobic with respect to the immersion liquid. In an embodiment, the element 106 is adhered to the first surface 102 by means of an adhesive 110. The adhesive 110 has a different composition from that of the liquidphobic material 112.

In an embodiment, there is provided an immersion lithographic apparatus, comprising: a projection system configured to project a patterned radiation beam through an immersion liquid onto a target portion of a substrate, an external surface of the projection system comprising a first surface having a non-planar shape; and an element attached to the first surface and positioned so that at least a portion of the element contacts the immersion liquid in use, wherein the element comprises a closed loop of continuously integral material in a preformed state and conforming to the non-planar shape of the first surface.

In an embodiment, the continuously integral material comprises a liquidphobic material, the liquidphobic material being liquidphobic with respect to the immersion liquid. In an embodiment, the element is adhered to the first surface by means of an adhesive having a different composition from that of the continuously integral material. In an embodiment, the continuously integral material comprises a liquidphobic material that is in direct contact with the adhesive, the liquidphobic material being liquidphobic with respect to the immersion liquid. In an embodiment, the continuously integral material comprises a liquidphobic material, the liquidphobic material being liquidphobic with respect to the immersion liquid; the element comprises a liquidphobic material layer and a support layer; the liquidphobic material layer is formed from the liquidphobic material; the support layer supports the liquidphobic material layer and has a higher rigidity than the liquidphobic material layer; and the support layer is in direct contact with the adhesive. In an embodiment, the liquidphobic material layer comprises a coating formed on the support layer. In an embodiment, the element is disconnectable from the first surface in a single piece and in such a way that the closed loop remains closed or wherein the element is disconnectable from the first surface by manually peeling the element away from the first surface. In an embodiment, the continuously integral material comprises PTFE and/or wherein at least a portion of the first surface is frusto-conical. In an embodiment, the element is configured such that the element would retain the non-planar shape of the first surface even if unattached to the first surface. In an embodiment, the external surface further comprises a second surface that is radially outside of the first surface; the second surface is inclined relative to the first surface; the element comprises a first integrally formed portion that forms a closed loop of continuously integral material, the first integrally formed portion being attached to the first surface; the element comprises a second integrally formed portion that forms a closed loop of continuously integral material, the second integrally formed portion being attached to the second surface; and the first integrally formed portion is joined integrally to the second integrally formed portion along a continuous line forming a closed loop. In an embodiment, the second surface is inclined relative to the first surface at all points along the continuous line and/or wherein the second surface is planar. In an embodiment, the first surface is radially outside of an exit surface through which the patterned radiation beam exits the projection system along a projection axis of the projection system, and the second surface is perpendicular to the projection axis. In an embodiment, the element is disconnectable from the first and second surfaces in a single piece and in such a way that the closed loop of the first integrally formed portion and the closed loop of the second integrally formed portion remain closed or wherein the element is disconnectable from the first and second surfaces by manually peeling the element away from the first and second surfaces. In an embodiment, the continuously integral material comprises a liquidphobic material and the liquidphobic material is hydrophobic.

In an embodiment, there is provided a device manufacturing method, comprising: using a projection system to project a patterned radiation beam through an immersion liquid onto a target portion of a substrate, wherein an external surface of the projection system comprises a first surface having a non-planar shape; and an element is attached to the first surface, the element being positioned so that at least a portion of the element contacts the immersion liquid, and wherein the element comprises a closed loop of continuously integral material in a preformed state and conforming to the non-planar shape of the first surface.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus, comprising:
   a projection system configured to project a patterned radiation beam through an immersion liquid onto a target portion of a substrate, an external surface of the projection system comprising a first surface having a non-planar shape; and
   an element attached to the first surface and positioned so that at least a portion of the element contacts the immersion liquid in use, wherein the element comprises a closed loop of continuously integral material in a preformed state and conforming to the non-planar shape of the first surface.

2. The apparatus of claim 1, wherein the continuously integral material comprises a liquidphobic material, the liquidphobic material being liquidphobic with respect to the immersion liquid.

3. The apparatus of claim 1, wherein the element is adhered to the first surface by means of an adhesive having a different composition from that of the continuously integral material.

4. The apparatus of claim 3, wherein the continuously integral material comprises a liquidphobic material that is in direct contact with the adhesive, the liquidphobic material being liquidphobic with respect to the immersion liquid.

5. The apparatus of claim 3, wherein:
   the continuously integral material comprises a liquidphobic material, the liquidphobic material being liquidphobic with respect to the immersion liquid;
   the element comprises a liquidphobic material layer and a support layer;
   the liquidphobic material layer is formed from the liquidphobic material;
   the support layer supports the liquidphobic material layer and has a higher rigidity than the liquidphobic material layer; and
   the support layer is in direct contact with the adhesive.

6. The apparatus of claim 5, wherein the liquidphobic material layer comprises a coating formed on the support layer.

7. The apparatus of claim 1, wherein the element is disconnectable from the first surface in a single piece and in such a way that the closed loop remains closed.

8. The apparatus of claim 1, wherein the continuously integral material comprises PTFE.

9. The apparatus of claim 1, wherein the element is configured such that the element would retain the non-planar shape of the first surface even if unattached to the first surface.

10. The apparatus of claim 1, wherein:
    the external surface further comprises a second surface that is radially outside of the first surface;
    the second surface is inclined relative to the first surface;
    the element comprises a first integrally formed portion that forms a closed loop of continuously integral material, the first integrally formed portion being attached to the first surface;
    the element comprises a second integrally formed portion that forms a closed loop of continuously integral material, the second integrally formed portion being attached to the second surface; and
    the first integrally formed portion is joined integrally to the second integrally formed portion along a continuous line forming a closed loop.

11. The apparatus of claim 10, wherein the second surface is inclined relative to the first surface at all points along the continuous line and/or wherein the second surface is planar.

12. The apparatus of claim 10, wherein the first surface is radially outside of an exit surface through which the patterned radiation beam exits the projection system along a projection axis of the projection system, and the second surface is perpendicular to the projection axis.

13. The apparatus of claim 10, wherein the element is disconnectable from the first and second surfaces in a single piece and in such a way that the closed loop of the first integrally formed portion and the closed loop of the second integrally formed portion remain closed or wherein the element is disconnectable from the first and second surfaces by manually peeling the element away from the first and second surfaces.

14. The apparatus of claim 1, wherein the continuously integral material comprises a liquidphobic material and the liquidphobic material is hydrophobic.

15. The apparatus of claim 1, wherein the element is disconnectable from the first surface by manually peeling the element away from the first surface.

16. The apparatus of claim 1, wherein at least a portion of the first surface is frusto-conical.

17. A device manufacturing method, comprising:
    using a projection system to project a patterned radiation beam through an immersion liquid onto a target portion of a substrate, wherein:
    an external surface of the projection system comprises a first surface having a non-planar shape; and
    an element is attached to the first surface, the element being positioned so that at least a portion of the element contacts the immersion liquid, and wherein the element comprises a closed loop of continuously integral material in a preformed state and conforming to the non-planar shape of the first surface.

18. The method of claim 17, wherein the continuously integral material comprises a liquidphobic material, the liquidphobic material being liquidphobic with respect to the immersion liquid.

19. The method of claim 17, wherein the element is adhered to the first surface by means of an adhesive having a different composition from that of the continuously integral material.

20. The method of claim 17, wherein the element is disconnectable from the first surface in a single piece and in such a way that the closed loop remains closed or wherein the element is disconnectable from the first surface by manually peeling the element away from the first surface.

* * * * *